United States Patent
Hong

(10) Patent No.: US 8,036,054 B2
(45) Date of Patent: Oct. 11, 2011

(54) SEMICONDUCTOR MEMORY DEVICE WITH IMPROVED SENSING MARGIN

(75) Inventor: Duck Hwa Hong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 450 days.

(21) Appl. No.: 12/286,877

(22) Filed: Oct. 2, 2008

(65) Prior Publication Data

US 2009/0303810 A1    Dec. 10, 2009

(30) Foreign Application Priority Data

Jun. 5, 2008  (KR) .................. 10-2008-0053044

(51) Int. Cl.
*G11C 29/00* (2006.01)
*G11C 7/00* (2006.01)
(52) U.S. Cl. ......... 365/201; 365/200; 365/191; 365/226
(58) Field of Classification Search .................. 365/191, 365/200, 201, 226
See application file for complete search history.

(56) References Cited

U.S. PATENT DOCUMENTS

| | | | | |
|---|---|---|---|---|
| 5,781,490 A * | 7/1998 | Ma et al. | | 365/226 |
| 6,104,653 A * | 8/2000 | Proebsting | | 365/203 |
| 6,500,598 B2 * | 12/2002 | Ichihara | | 430/270.13 |
| 6,657,903 B2 * | 12/2003 | Sung | | 365/189.09 |
| 6,914,840 B2 * | 7/2005 | Agata | | 365/210.15 |
| 6,967,880 B2 * | 11/2005 | Park | | 365/201 |
| 7,423,924 B2 | 9/2008 | Nobutoki et al. | | |
| 2003/0235095 A1 * | 12/2003 | Inoue | | 365/201 |

FOREIGN PATENT DOCUMENTS

| KR | 10-2003-0047074 A | 6/2003 |
|---|---|---|
| KR | 10-2007-0036629 A | 4/2007 |

* cited by examiner

*Primary Examiner* — Tuan Nguyen
*Assistant Examiner* — Lance Reidlinger
(74) *Attorney, Agent, or Firm* — John P. White; Cooper & Dunham LLP

(57) ABSTRACT

A semiconductor memory device includes a signal generating unit for generating first and second enable signals in response to a power-up signal, a first sub-word line signal driving unit for driving a first sub-word line signal in response to the first enable signal, a first voltage supplying unit for supplying a first voltage to a pair of bit lines in response to the first enable signal, a second sub-word line signal driving unit for driving a second sub-word line signal in response to the second enable signal, and a second voltage supplying unit for supplying a second voltage to a pair of bit lines in response to the second enable signal.

15 Claims, 5 Drawing Sheets

SEMICONDUCTOR MEMORY DEVICE WITH IMPROVED SENSING MARGIN

TECHNICAL FIELD

The present disclosure relates to a semiconductor memory device, and more particularly to a semiconductor memory device capable of preventing a data sensing margin from being reduced due to a coupling phenomenon of a cell capacitor.

BACKGROUND

A semiconductor memory includes a plurality of memory cells. Each memory cell includes a cell transistor and a cell capacitor. The cell transistor is connected between a bit line and a storage node, and turned on in response to a word line. The cell capacitor is connected between the storage node and a terminal of a cell plate voltage.

The storage node has an electrical floating state if the cell transistor is not turned on due to enabling of a word line, and may have 0V similarly to all adjacent nodes before a power is applied. If a power is applied, the cell plate voltage and a voltage of the bit line rise to a ½ level (about 950 mV) of a core voltage VCORE, and a voltage of the word line is maintained to 0V. In this case, a bulk voltage of the cell transistor drops to −0.8V. In this state, the storage node that is connected with the cell plate voltage terminal through the cell capacitor has a voltage level (about 938 mV) slightly lower than a ½ level of the core voltage VCORE.

The above state, in which the voltage level of the storage node becomes the voltage level (about 938 mV) slightly lower than a ½ level of the core voltage VCORE, is maintained until a first active command is input after the power is applied. In other words, if the active command is input so that the word line is in an active state, the state of the storage node may be recognized as '0' state, so that the voltage level of the storage node may be dropped to 0V through the sensing of a sense amplifier.

If the voltage level of the storage node becomes 0V, the cell plate voltage may be level-downed due to the coupling phenomenon of the cell capacitor. Although the level-downed cell plate voltage is recovered to an original voltage level (the ½ level of the core voltage VCORE), since the voltage level of the storage node rises, the '0' data sensing margin is reduced.

SUMMARY

In an aspect of the present disclosure, a semiconductor memory device that is capable of preventing a data sensing margin from being reduced due to the coupling phenomenon of a cell capacitor by storing high-level data or low-level data in a storage node during power-up duration.

In an embodiment, a semiconductor memory device includes a signal generating unit for generating first and second enable signals in response to a power-up signal, a first sub-word line signal driving unit for driving a first sub-word line signal in response to the first enable signal, a first voltage supplying unit for supplying a first voltage to a pair of bit lines in response to the first enable signal, a second sub-word line signal driving unit for driving a second sub-word line signal in response to the second enable signal, and a second voltage supplying unit for supplying a second voltage to a pair of bit lines in response to the second enable signal.

The signal generating unit can includes a test mode signal generating unit for generating first and second test mode signals in response to the power-up signal, a firs enable signal generating unit for generating the first enable signal in response to the first and second test mode signals, and a second enable signal generating unit for generating the second enable signal in response to the second test mode signal and an active signal.

The test mode signal generating unit can include a first pull-up unit for pull-up driving the first test mode signal in response to the power-up signal, a delay unit for delaying the power-up signal by a predetermined duration, and a second pull-up unit for pull-up driving the second test mode signal in response to an output signal of the delay unit.

Preferably, the second test mode signal can be enabled after a predetermined duration elapses from a time point at which the first test mode signal is enabled.

Preferably, the first enable signal generated from the first enable signal generating unit can enabled when the first test mode signal is enabled, and wherein the first enable signal is disabled when the second test mode signal is enabled.

The first enable signal generating unit can include a latch configured to receive an inverted signal of the first test mode signal as a set signal, and receive an inverted signal of the second test mode signal a reset signal.

The first enable signal generating unit can further include a buffer for buffering an output signal of the latch to generate the first enable signal.

Preferably, the second enable signal generated from the second enable signal generating unit can be enabled when the second test mode signal is enabled, and wherein the second enable signal is disabled when the active signal is enabled.

The second enable signal generating unit can include a latch configured to receive an inverted signal of the second test mode signal as a set signal, and receive an inverted signal of the active signal a reset signal.

The second enable signal generating unit can further include a buffer for buffering an output signal of the latch to generate the second enable signal.

The first voltage supplying unit includes a switch connected between a terminal of the first voltage and a power line connected to the paired bit lines, and turned on in response to the first enable signal.

Preferably, the first voltage is a core voltage.

The second voltage supplying unit includes a switch connected between a terminal of the second voltage and a power line connected to the paired bit lines, and turned on in response to the second enable signal.

Preferably, the second voltage is a grounding voltage.

In another embodiment, a semiconductor memory device includes a signal generating unit for generating a test mode signal in response to a power-up signal, a voltage supplying unit for supplying a predetermined voltage to a pair of bit lines in response to the test mode signal, and a memory cell unit for driving all sub-word lines connected to a memory cell array in response to the test mode signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and embodiments of the present disclosure will be described with reference to accompanying drawings. However, the examples and embodiments are for illustrative purposes only and are not intended to limit the scope of the invention.

Figure 1:
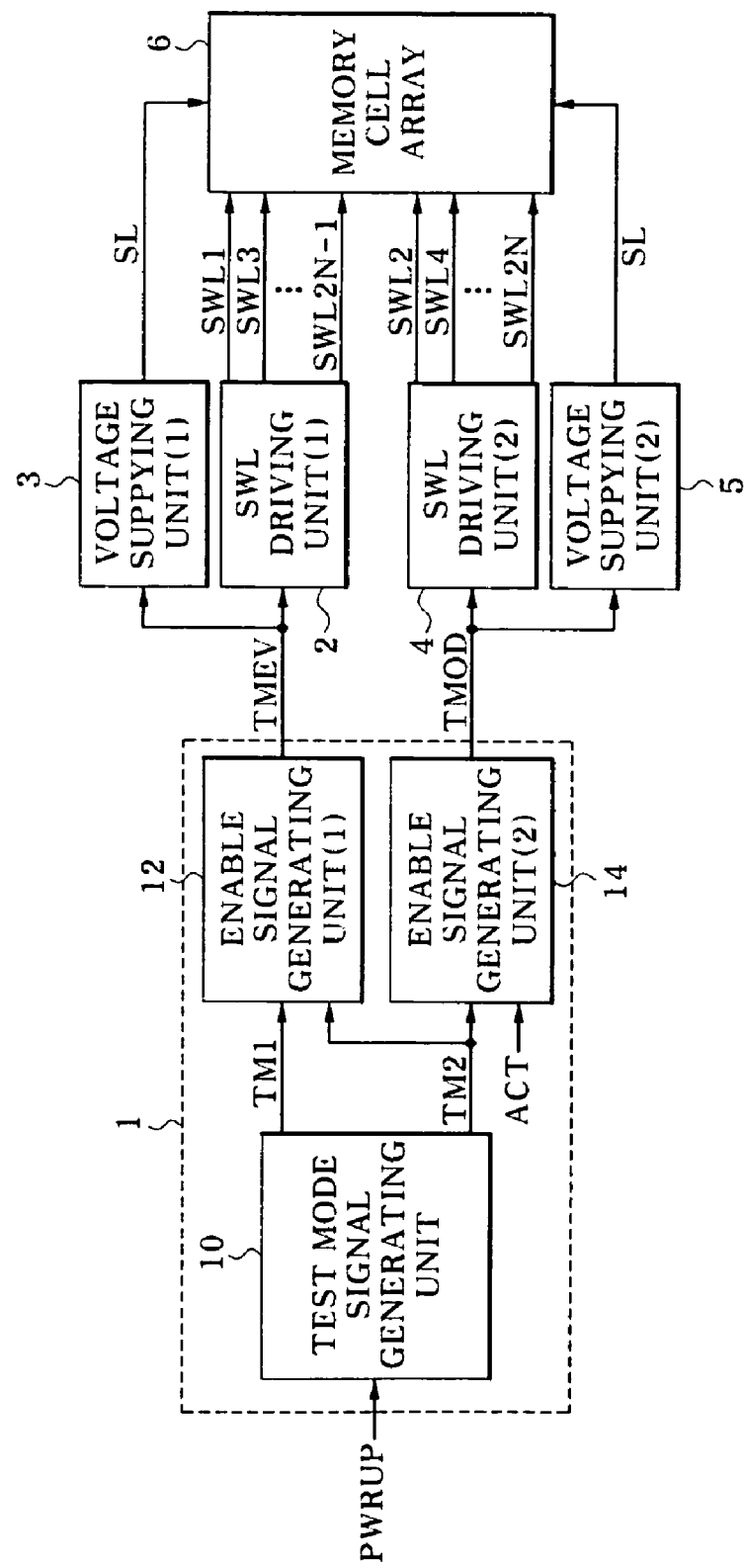
FIG. 1 is a block diagram showing an embodiment of a structure of a semiconductor memory device according to an embodiment of the present disclosure.

FIG. 1 is a block diagram showing an example of a structure of a semiconductor memory device according to an embodiment of the present disclosure.

As shown in an example of FIG. 1, the semiconductor memory device according to the present embodiment includes a signal generating unit 1, a first sub-word line signal driving unit 2, a first voltage supplying unit 3, a second sub-word line signal driving unit 4, a second voltage supplying unit 5, and a memory cell array 6.

The signal generating unit 1 includes a test mode signal generating unit 10, a first enable signal generating unit 12, and a second enable signal generating unit 14. The test mode signal generating unit 10 generates a first test mode signal TM1 and a second test mode signal TM2 in response to a power-up signal PWRUP. The first enable signal generating unit 12 generates a first enable signal TMEV in response to both the first test mode signal TM1 and the second test mode signals TM2. The second enable signal generating unit 14 generates a second enable signal TM_OD in response to both the second test mode signal TM2 and an active signal ACT.

Figure 2:
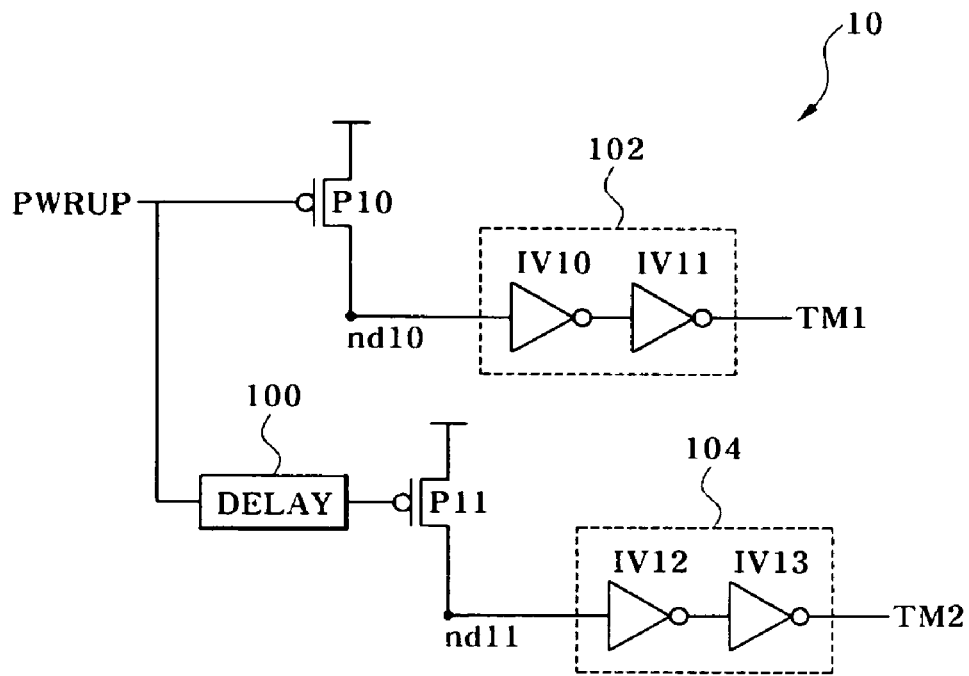
FIG. 2 is a circuit diagram showing an embodiment of a test mode signal generating unit of the semiconductor memory device shown in FIG. 1.

Referring to the example of FIG. 2, the test mode signal generating unit 10 includes a PMOS transistor P10, a buffer 102, a delay unit 100, a PMOS transistor P11, and a buffer 104. The PMOS transistor P10 pull-up drives a node nd10 in response to the power-up signal PWRUP. The buffer 102 buffers a signal of the node nd10 to generate the first test mode signal TM1. The delay unit 100 delays the power-up signal PWRUP by predetermined duration. The PMOS transistor P11 pull-up drives a node nd11 in response to an output signal of the delay unit 100. The buffer 104 buffers a signal of the node nd11 to generate the second test mode signal TM2. The delay duration of the delay unit 100 must be set such that the first and second test mode signals TM1 and TM2 are not simultaneously enabled at a high level.

Figure 3:
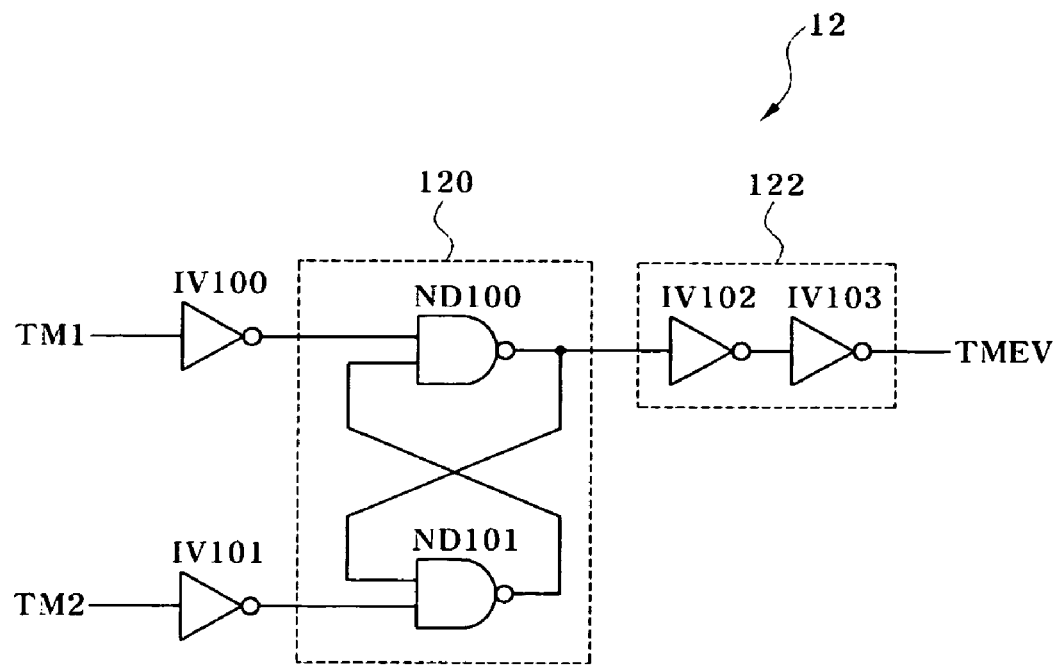
FIG. 3 is a circuit diagram showing an embodiment of a first enable signal generating unit of the semiconductor device shown in FIG. 1.

Referring to the example of FIG. 3, the first enable signal generating unit 12 includes a NAND gate latch 120 and a buffer 122. The NAND gate latch 120 receives and latches inverted signals of the first test mode signal TM1 and the second test mode signal TM2. The NAND gate latch 120 receives the inverted signal of the first test mode signal TM1 as a set signal, and receives the inverted signal of the second test mode signal TM2 as a reset signal. Accordingly, the first enable signal TMEV generated from the first enable signal generating unit 12 is enabled at a high level when the first test mode signal TM1 is enabled at a high level. In addition, the first enable signal TMEV is disabled at a low level when the second test mode signal TM2 is enabled at a high level.

Figure 4:
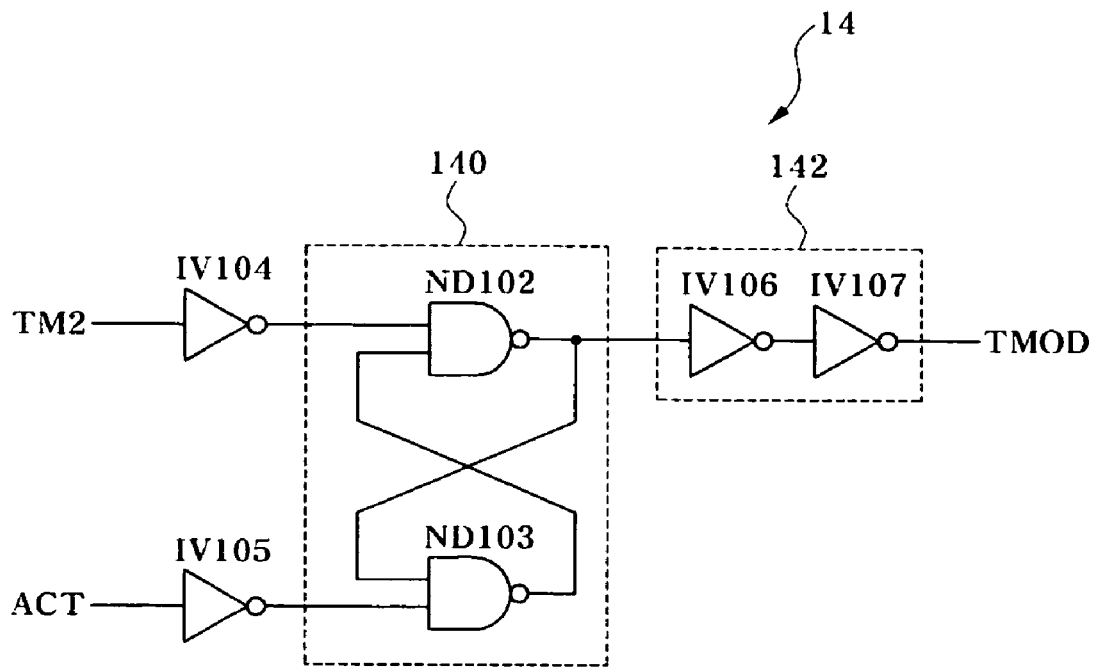
FIG. 4 is a circuit diagram showing an embodiment of a second enable signal generating unit of the semiconductor memory device shown in FIG. 1.

Referring to the example of FIG. 4, the second enable signal generating unit 14 includes a NAND gate latch 140 and a buffer 142. The NAND gate latch 140 receives and latches inverted signals of the second test mode signal TM2 and the active signal ACT enabled at a high level when performing an active operation. The NAND gate latch 140 receives the inverted signal of the second test mode signal TM2 as a set signal, and receives the inverted signal of the active signal ACT as a reset signal. Accordingly, the second enable signal TMOD generated from the second enable signal generating unit 14 is enabled at a high level when the second test mode signal TM2 is enabled at a high level. In addition, the second enable signal TMOD is disabled at a low level when the active signal ACT is enabled at a high level.

The first sub-word line signal driving unit 2 receives the first enable signal TMEV to drive odd sub-word line signals SWL1, SWL3, . . . , and SWL2N-1. In other words, the first sub-word line signal driving unit 2 drives the odd sub-word line signals SWL1, SWL3, . . . , and SWL2N-1 at a high level when the fist enable signal TMEV is at a high level. Since the first sub-word line signal driving unit 2 may be realized as a typical sub-word line driving circuit, the detailed description of components of the first sub-word line signal driving unit 2 will be omitted.

Figure 5:
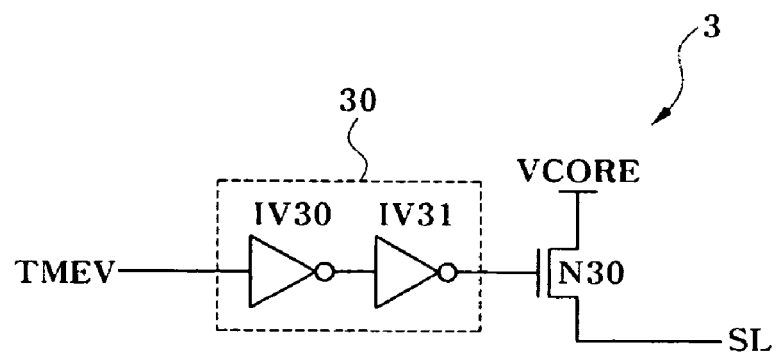
FIG. 5 is a circuit diagram showing an embodiment of a first voltage supplying unit of the semiconductor memory device shown in FIG. 1.

Referring to the example of FIG. 5, the first voltage supplying unit 3 includes a buffer 30 and an NMOS transistor N30. The buffer 30 buffers the first enable signal TMEV. The NMOS transistor N30 is turned on in response to an output signal of the buffer 30 to supply a core voltage VCORE to a power line SL. The first voltage supplying unit 3 supplies the core voltage VCORE to the power line SL when the first enable signal TMEVE is at a high level.

The second sub-word line signal driving unit 4 receives the second enable signal TMOD to drive even sub-word lines SWL2, SWL4, . . . and SWL2N. In other words, the second sub-word line signal driving unit 4 drives the even sub-word lines SWL2, SWL4, . . . , and SWL2N to a high level when the second enable signal TMOD is at a high level. Since the second sub-word line signal driving unit 4 can be realized as a typical sub-word line signal driving unit, the detailed description of components of the second sub-word line signal driving unit 4 will be omitted.

Figure 6:
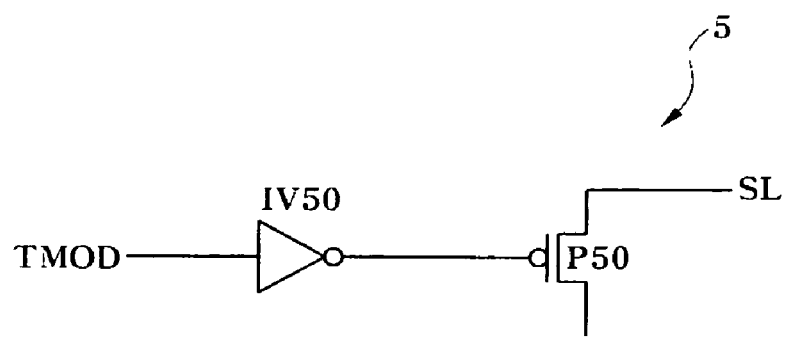
FIG. 6 is a circuit diagram showing an embodiment of a second voltage supplying unit of the semiconductor memory device shown in FIG. 1.

Referring to the example of FIG. 6, the second voltage supplying unit 5 includes a PMOS transistor P50 that is turned on in response to an inverted signal of the second enable signal TMOD to pull-down drive the power line SL to a level of a grounding voltage VSS. In other words, the second voltage supplying unit 5 pull-down drives the power line SL to the level of the grounding voltage VSS when the second enable signal TMOD is at a high level.

Figure 7:
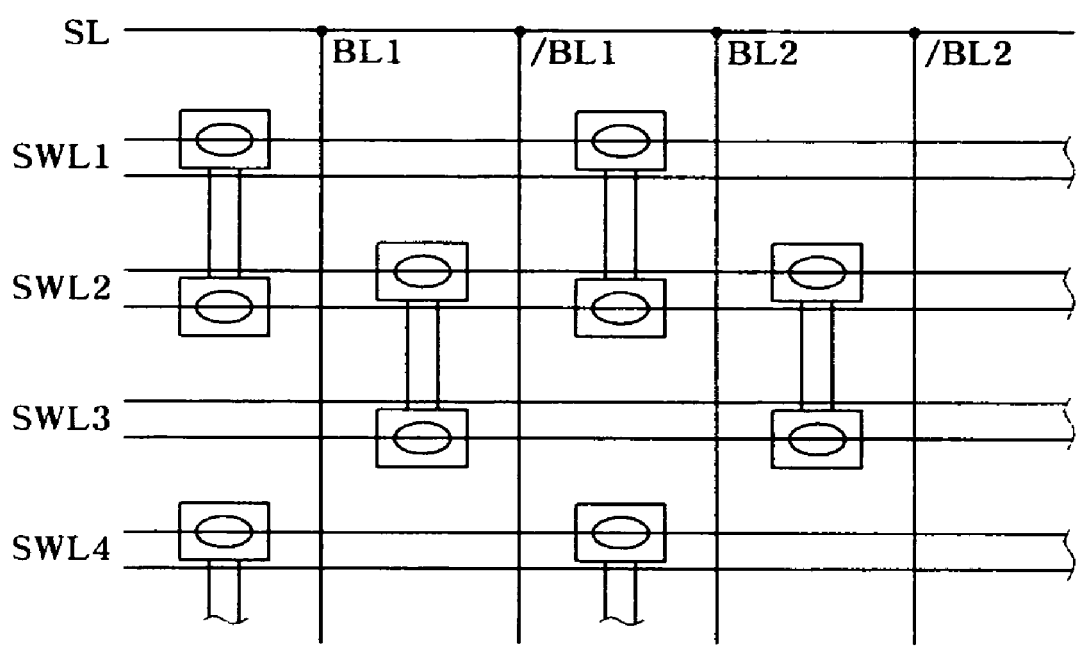
FIG. 7 is a view showing an embodiment of a memory cell array of the semiconductor memory device shown in FIG. 1.

Referring to the example of FIG. 7, the memory cell array 6 includes a plurality of memory cells. The memory cells are connected to a plurality of sub-word lines, which are driven by the plural sub-word line signals SWL1 to SWL4, and a plurality of paired bit lines BL1, /BL1, BL2, and /BL2. A plurality of the paired bit lines BL1, /BL1, BL2, and /BL2 are connected to the power line SL.

Hereinafter, the operational procedure of the semiconductor memory device having the above structure will be described with reference to FIGS. 1 to 7.

When a power is applied to the semiconductor memory device, the power-up signal PWRUP is maintained at a low level during predetermined duration. Then, the power-up signal PWRUP transits from a low level to a high level. In this case, duration at which the power-up signal PWRUP is maintained at a low level is referred to as "power-up duration".

When the power-up signal PWRUP having a low level is applied to the semiconductor memory device at the power-up duration, the test mode signal generating unit 10 shown in the example of FIG. 2 generates the first test mode signal TM1, which is enabled at a high level, and the second test mode signal TM2, which is enabled at a low level. In other words, since the PMOS transistor P10 is turned on, and the PMOS transistor P11 is turned off during the delay duration of the delay unit 100 due to the power-up signal PWRUP having the low level, the first test mode signal TM1 is driven to a high level, and the second test mode signal TM2 is driven to a low level.

As shown in the example of FIG. 3, since the first enable signal generating unit 12 receives the first test mode signal TM1 as a set signal, the first enable signal TMEV having a high level is output when the first test mode signal TM1 having a high level is input.

The first enable signal TMEV having a high level turns on the NMOS transistor N30 of the first voltage supplying unit 3 shown in the example of FIG. 5 to drive the power line SL to the core voltage VOCRE. The first sub-word line signal driving unit 2, which has received the first enable signal TMEV having a high level, drives the odd sub-word line signals SWL1, SWL3, . . . , and SWL2N-1 to a high level. Accordingly, cell transistors belonging to memory cells connected to the odd sub-word line signals SWL1, SWL3, . . . , and SWL2N-1, which are driven to a high level, are turned on. In addition, the core voltage VOCRE is supplied to the paired bit lines through the power line SL. Accordingly, storage nodes of the memory cells, which are connected to the odd sub-word line signals SWL1, SWL3, . . . , and SWL2N-1, store the core voltage VOCRE.

Next, if the power-up signal PWRUP transits to a high level after the power-up duration is terminated, the PMOS transistor P10 is turned off such that the first test mode signal TM1 transits to a low level. In this case, since the output signal of the delay unit 100 transits to the low level after the delay duration of the delay unit 100 elapses from a time point at which TM1 transits to a high level, the PMOS transistor P11 is turned on such that the second test mode signal TM2 transits to a high level.

As shown in the example of FIG. 4, since the second enable signal generating unit 14 receives the second test mode signal TM2 as a set signal, the second enable signal generating unit 14 outputs the second enable signal TMOD having a high level when the second test mode signal TM2 having a high level is input.

The second enable signal TMOD having a high level turns on the PMOS transistor P50 of the second voltage supplying unit 5 shown in the example of FIG. 6 to drive the power line SL to the grounding voltage VSS. The second sub-word line signal driving unit 4, which has received the second enable signal TMOD having a high level, drives the even sub-word line signals SWL2, SWL4, . . . , and SWL2N to a high level. Accordingly, cell transistors belonging to memory cells connected to the even sub-word line signals SWL2, SWL4, . . . , and SWL2N, which are driven to a high level, are turned on, and the grounding voltage VSS is supplied to the paired bit lines through the power line SL. Accordingly, storage nodes of the memory cells, which are connected to the even sub-word line signals SWL2, SWL4, . . . , and SWL2N, store the grounding voltage VSS.

Next, when an active command is input so that the active signal ACT transits to a high level, the second test mode signal TM2 transits to a low level so that the second enable signal TMOD is disabled at a low level.

As described above, the semiconductor memory device according to the present embodiment initializes the storage nodes, which belong to the memory cells, to the core voltage VCORE or the grounding voltage VSS until the active operation is performed after the power-up signal PWRUP is applied. Accordingly, the storage node is not floated until a first active command is input after a power is applied, so that a data sensing margin can be prevented from being reduced due to the coupling phenomenon of a cell capacitor.

According to the present embodiment, the storage nodes of the memory cells, which are connected to the odd sub-word line signals SWL1, SWL3, . . . , and SWL2N-1, are initialized to the core voltage VCORE. In addition, the storage nodes of the memory cells, which are connected to the even sub-word line signals SWL2, SWL4, . . . , and SWL2N, are initialized to the grounding voltage VSS.

Figure 8:
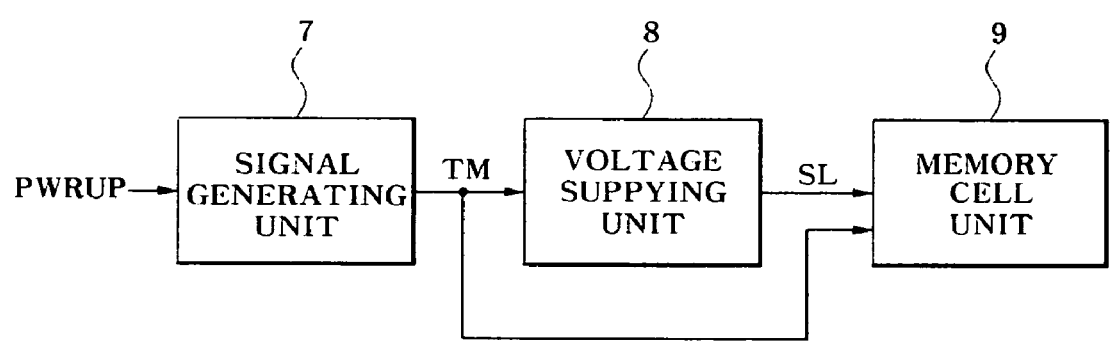
FIG. 8 is a block diagram showing an embodiment of a structure of a semiconductor memory device according to another embodiment of the present disclosure.

FIG. 8 is a block diagram showing an example of a structure of a semiconductor memory device according to another embodiment of the present disclosure.

As shown in the example of FIG. 8, a semiconductor memory device according to the present embodiment includes a signal generating unit 7, a voltage supplying unit 8, and a memory cell unit 9.

The signal generating unit 7 receives a power-up signal PWRUP to generate a test mode signal TM, which is enabled at a high level, at the power-up duration.

The power supplying unit 8 receives the test mode signal TM having the high level to supply a core voltage VCORE or a grounding voltage VSS to a power line SL.

The memory cell unit 9 receives the test mode signal TM having the high level to drive all sub-word line signals connected to a memory cell array (not shown). In this case, since all bit lines connected to the memory cell array receive the core voltage VCORE or the grounding voltage VSS through the power line SL, all storage nodes of the memory cell array are initialized to the core voltage VCORE or the grounding voltage VSS.

Although examples and embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application 10-2008-0053044, filed on Jun. 5, 2008, the entire contents of which are incorporated herein by reference

What is claimed is:

1. A semiconductor memory device comprising:
a test mode signal generating unit for generating first and second test mode signals in response to a power-up signal;
a first enable signal generating unit for generating a first enable signal in response to the first and second test mode signals;
a second enable signal generating unit for generating a second enable signal in response to the second test mode signal and an active signal;
a first sub-word line signal driving unit for driving a first sub-word line signal in response to the first enable signal;

a first voltage supplying unit for supplying a first voltage to a pair of bit lines in response to the first enable signal;

a second sub-word line signal driving unit for driving a second sub-word line signal in response to the second enable signal; and a second voltage supplying unit for supplying a second voltage to the pair of bit lines in response to the second enable signal.

2. The semiconductor memory device of claim 1, wherein the test mode signal generating unit includes:

a first pull-up unit for pull-up driving the first test mode signal in response to the power-up signal;

a delay unit for delaying the power-up signal by a predetermined duration; and a second pull-up unit for pull-up driving the second test mode signal in response to an output signal of the delay unit.

3. The semiconductor memory device of claim 1, wherein the second test mode signal is enabled after a predetermined duration elapses from a time point at which the first test mode signal is enabled.

4. The semiconductor memory device of claim 1, wherein the first enable signal generated from the first enable signal generating unit is enabled when the first test mode signal is enabled, and wherein the first enable signal is disabled when the second test mode signal is enabled.

5. The semiconductor memory device of claim 1, wherein the first enable signal generating unit includes a latch configured to receive an inverted signal of the first test mode signal as a set signal, and receive an inverted signal of the second test mode signal a reset signal.

6. The semiconductor memory device of claim 5, wherein the first enable signal generating unit further includes a buffer for buffering an output signal of the latch to generate the first enable signal.

7. The semiconductor memory device of claim 1, wherein the second enable signal generated from the second enable signal generating unit is enabled when the second test mode signal is enabled, and wherein the second enable signal is disabled when the active signal is enabled.

8. The semiconductor memory device of claim 1, wherein the second enable signal generating unit includes a latch configured to receive an inverted signal of the second test mode signal as a set signal, and receive an inverted signal of the active signal a reset signal.

9. The semiconductor memory device of claim 8, wherein the second enable signal generating unit further includes a buffer for buffering an output signal of the latch to generate the second enable signal.

10. The semiconductor memory device of claim 1, wherein the first voltage supplying unit includes a switch connected between a terminal of the first voltage and a power line connected to the paired bit lines, and turned on in response to the first enable signal.

11. The semiconductor memory device of claim 10, wherein the first voltage is a core voltage.

12. The semiconductor memory device of claim 11, wherein the switch is an NMOS transistor.

13. The semiconductor memory device of claim 1, wherein the second voltage supplying unit includes a switch connected between a terminal of the second voltage and a power line connected to the paired bit lines, and turned on in response to the second enable signal.

14. The semiconductor memory device of claim 13, wherein the second voltage is a grounding voltage.

15. The semiconductor memory device of claim 14, wherein the switch is a PMOS transistor.

\* \* \* \* \*